(12) United States Patent
Koc et al.

(10) Patent No.: US 12,087,348 B2
(45) Date of Patent: Sep. 10, 2024

(54) DYNAMIC RANDOM ACCESS MEMORY (DRAM) STRUCTURE WITH BODY BIAS VOLTAGE THAT CAN BE ADAPTED TO THE ACCESS PATTERN OF CELLS

(71) Applicant: TOBB EKONOMI VE TEKNOLOJI UNIVERSITESI, Ankara (TR)

(72) Inventors: Fahrettin Koc, Ankara (TR); Oguz Ergin, Ankara (TR)

(*) Notice: Subject to any disclaimer, the term of this patent is extended or adjusted under 35 U.S.C. 154(b) by 0 days.

(21) Appl. No.: 17/766,326

(22) PCT Filed: Nov. 6, 2020

(86) PCT No.: PCT/TR2020/051058
§ 371 (c)(1),
(2) Date: Apr. 4, 2022

(87) PCT Pub. No.: WO2021/091518
PCT Pub. Date: May 14, 2021

(65) Prior Publication Data
US 2024/0055040 A1 Feb. 15, 2024

(30) Foreign Application Priority Data
Nov. 7, 2019 (TR) .................. 2019/17243

(51) Int. Cl.
*G11C 11/24* (2006.01)
*G11C 11/4074* (2006.01)

(52) U.S. Cl.
CPC .............................. *G11C 11/4074* (2013.01)

(58) Field of Classification Search
CPC .................................................. G11C 11/4074

USPC ......................................................... 365/149
See application file for complete search history.

(56) References Cited

U.S. PATENT DOCUMENTS

| 5,909,618 | A  | * | 6/1999  | Forbes  | H10B 12/395 |
|-----------|----|---|---------|---------|-------------|
|           |    |   |         |         | 438/242     |
| 8,696,522 | B2 | * | 4/2014  | Brady   | A63B 69/0093 |
|           |    |   |         |         | 482/71      |
| 9,251,866 | B2 | * | 2/2016  | Chun    | H01L 27/092 |
| 9,431,068 | B2 | * | 8/2016  | Clark   | G11C 5/146  |
| 9,672,891 | B2 | * | 6/2017  | Kang    | G11C 5/025  |
| 9,853,019 | B2 | * | 12/2017 | Clark   | H03K 3/012  |
| 10,002,657 | B2 | * | 6/2018  | Oh      | G11C 11/40618 |
| 10,431,300 | B2 | * | 10/2019 | Pyo     | G11C 13/0033 |

(Continued)

FOREIGN PATENT DOCUMENTS

CN    1655365 A  *  8/2005  ......... H01L 29/4908
CN    101221953 A  *  7/2008

(Continued)

OTHER PUBLICATIONS

International Search Report for corresponding PCT/TR2020/051058, dated Dec. 21, 2021.

(Continued)

*Primary Examiner* — Viet Q Nguyen
(74) *Attorney, Agent, or Firm* — Egbert, McDaniel & Swartz, PLLC

(57) ABSTRACT

Disclosed is an adaptive application of bias voltages to the access transistors in the cells in dynamic random access memory (DRAM) structures, according to the access pattern of the rows, in other words, whether the rows are accessed and/or how often rows are accessed.

7 Claims, 1 Drawing Sheet

(56) References Cited

U.S. PATENT DOCUMENTS

Figure 1:
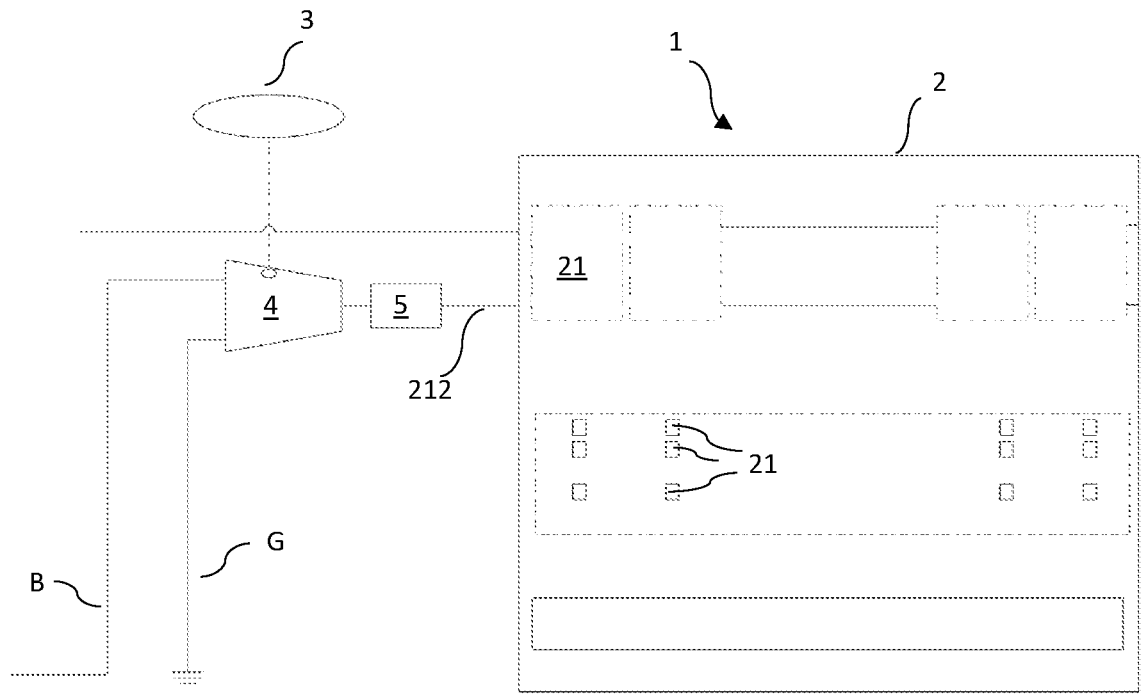

| | | | |
|---|---|---|---|
| 10,685,703 B2* | 6/2020 | Singh | G11C 8/08 |
| 11,262,780 B1* | 3/2022 | Brox | G11C 5/146 |
| 2003/0067824 A1 | 4/2003 | Janzen | |
| 2003/0067826 A1 | 4/2003 | Janzen | |
| 2010/0332943 A1 | 12/2010 | D'Abreu et al. | |
| 2014/0254259 A1* | 9/2014 | Widjaja | H01Q 1/2283 |
| | | | 365/182 |
| 2015/0199134 A1 | 7/2015 | Mondal et al. | |
| 2016/0336056 A1 | 11/2016 | Clark et al. | |

FOREIGN PATENT DOCUMENTS

| | | | | |
|---|---|---|---|---|
| CN | 102683418 A | * | 9/2012 | |
| WO | WO-2021010923 A1 | * | 1/2021 | G11C 11/4074 |

OTHER PUBLICATIONS

Written Opinion of the International Searching Authority for corresponding PCT/TR2020/051058, dated Dec. 21, 2021.
Hassan et al., "ChargeCache: Reducing DRAM latency by exploiting row access locality", In 2016 IEEE International Symposium on High Performance Computer Architecture, Mar. 2016, pp. 581-593.
Chang et al., "Understanding latency variation in modern DRAM chips: Experimental characterization, analysis, and optimization", In Proceedings of the 2016 ACM SIGMETRICS International Conference on Measurement and Modeling of Computer Science, Jun. 2016, pp. 323-336.

* cited by examiner

DYNAMIC RANDOM ACCESS MEMORY (DRAM) STRUCTURE WITH BODY BIAS VOLTAGE THAT CAN BE ADAPTED TO THE ACCESS PATTERN OF CELLS

TECHNICAL FIELD

This invention relates to the adaptive application of bias voltages to the access transistors in cells in dynamic random access memory (hereinafter referred to as DRAM) structures, according to the access pattern of the rows, in other words, whether the rows are accessed and/or how often rows are accessed.

PRIOR ART

Currently, DRAM manufacturers determine predetermined refresh times for DRAMs during factory-level production, and retention times arise according to DRAM characteristics. The refresh time can be expressed as a predetermined time during which the capacitor for storing data in the cells is periodically recharged before discharging retention time can be expressed as when a cell can store data without regeneration.

Some of the cells on a DRAM are weaker than the other cells. If a cell is weak, it means that the cell loses the data, it stores in a shorter time than other cells; in other words, the retention time is shorter. Some cells can keep the data in them for a longer time. These changes in retention time are caused by differences due to production. Even if the proportion of weak cells is low, the frequency of refresh for all DRAM cells is determined by the manufacturers according to the cells' retention time value. In this case, a refresh is performed for many cells (even for cells/rows that are not weak) unnecessarily.

The refresh process directly affects the performance of DRAMs. Since reading and writing cannot be done during refresh, incoming requests for these cells must be held. Therefore, to reduce power consumption and increase performance and performance, a reduction in the total number of refreshes or the frequency of refreshes is required.

During the DRAM usage (operation), the processor accesses the cells and rows in the DRAM and reads data from the relevant rows and/or data is written to the relevant cells. Not every cell in DRAM is used in the same frequency. Some cells are accessed more frequently, and data is read and/or written more frequently from those rows. When any cell is accessed by the processor for reading or writing data, the cell/row related to the data reading and writing process is refreshed. In other words, it can be thought that when the cells are accessed, the accessed cells are refreshed. According to general theories, the cells that have been accessed is more likely to be re-accessed than the cells that have not been accessed. For example, if the fiftieth row of DRAM has been accessed, the possibility of this row to be re-accessed is high. With the patent subject to application, the bias voltage is applied to the cells according to the access pattern by monitoring whether DRAM rows and cells are accessed and which cells are accessed. The bias voltage is applied to cells that are not accessible, not to the cells that the processor accesses. Thus, accessed cells are refreshed automatically, and with the bias voltage applied to non-access cells, the tightness of these cells is increased, and the frequency of refresh is extended.

With the patent subject to application, instead of applying a routine refresh time to all cells, the bias voltage is applied to some cells according to the access pattern of the cells, and the refresh time of all cells is increased. According to the access pattern of DRAM cells, the threshold value is increased by applying a bias voltage to non-access cells, thus requiring less refresh frequency. Reducing the refresh frequency means less power consumption and higher performance for DRAM. The patent subject to the application provides a decrease in the number of refreshes or refresh frequency with a different solution.

In the United States patent document US2003067824 A1, an application in state of the art, it is recommended to use a variable bias voltage generator to perform refresh at different times in self-refresh mode. Body bias voltage means applying the difference to body voltage. The said patent document describes how to create a difference in voltage for the clock generator. In the patent subject to application, the bias voltage is applied to some cells according to the access pattern of DRAM cells, resulting in a decrease in the number of refreshes or refresh frequency. By applying the bias voltage to cells that do not have access to DRAM (transistors located inside cells), the increase of the leakage current is adjusted by the bias voltage.

The United States patent document US2010332943 (A1), an application in state of the art, discloses a data refresh mechanism. The said mechanism includes a controller, a threshold adjuster, and a refresher. The system separates recently processed and controlled zones according to processing errors. It refreshes times not to refresh them repeatedly, setting thresholds and removing them from processing. In the said document, a threshold is set for the refresh time, and this threshold value can be set, so that refresh at different times becomes possible. In the patent subject to application, the bias voltage is applied to non-access cells according to the access pattern of DRAM cells, resulting in a decrease in the number of refreshes or refresh frequency. By applying the bias voltage to cells that do not have access to DRAM (transistors located inside cells), the increase of the leakage current is adjusted by the bias voltage.

BRIEF DESCRIPTION AND OBJECTS OF THE INVENTION

The object of the invention is to realize a DRAM which requires less refresh frequency by applying bias voltage to the non-access cells than in the state of the art basic designed DRAMs (depending on the applied bias voltage) according to the access pattern of DRAM cells, thus in which power consumption and reading/writing are less likely to interfere with refresh.

Another object of the present invention is to realize a DRAM which enables the increase of leakage current to be adjusted with the bias voltage by applying bias voltage to transistors in the non-access cells instead of refreshing cells that are not accessed at a predetermined frequency because DRAM's accessed cells are refreshed.

Another object of the present invention is to realize a DRAM that prevents leakage and performance decrease by increasing the threshold value of the non-access cells.

DETAILED DESCRIPTION OF THE INVENTION

An adaptive body bias voltage DRAM structure realized to achieve the objective of the present invention is shown in the accompanying figures, wherein FIG. 1. is the schematic view of the DRAM structure.

Figure 2:
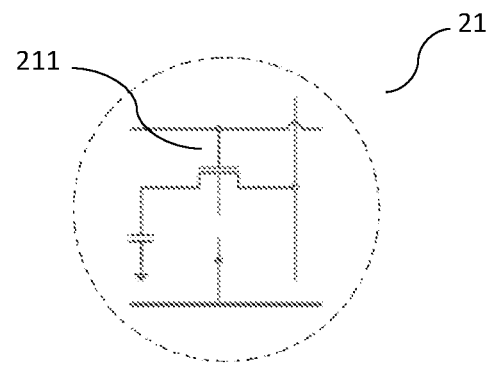

FIG. 2. is the schematic view of a cell.

The parts in the figures are numbered individually and the equivalents of these numbers are given below.
1. Adaptive body bias DRAM structure
2. Main DRAM
   21. Cell
      211. Access Transistor
      212. Bias line
3. Control unit
4. Multiplexer
5. Bias driver
G. Ground
B. bias voltage DRAM (1) with body bias adaptable according to the access pattern that enables the adaptive application of bias voltages to the cells (21) accessed by the processor and to the access transistors (211) of the cells (21) that are not accessed according to the access pattern of the cells (21), essentially comprises;
- at least one main DRAM (2) comprising at least one row of multiple cells (21),
- an access transistor (211) that together with a capacitor makes up each cell (21),
- a bias line (212) to which the sub terminals of each of the access transistors (211) in the cells (21) forming a row are connected,
- at least one multiplexer (4) to control whether the bias voltage (B) at a predetermined value is supplied to the bias line (212),
- at least one control unit (3), adapted to generate the output signal and transmit it to the multiplexer (4) in order to see which cells (21) are accessed and which cells (21) are not accessed for the purpose of writing or reading data by the processor, in other words, to look at the access pattern of the cells (21) or rows and to ensure that the bias voltage (B) is transmitted at a predetermined value to the non-access cells (21) or rows, which depends on the selection input of the multiplexer (4) and controls the operation of the multiplexer (4),
- at least one biasing driver (5), in which the bias voltage (B) to be transmitted to the bias line (212) is received from at least one of the data inputs of the multiplexer (4) according to the data arriving the multiplexer from the control unit (3).

The DRAM structure with substrate tension adaptable according to the cells (21) of the invention and the access pattern of the cells (21) is provided with a main DRAM (2) to store information such as data, program code and the like necessary for the processor in the electronic device to be used. The main DRAM (2) contains cells (21). Each cell (21) consists of a capacitor and an access transistor (211). The cells (21) consisting of a capacitor and the access transistor (211) come together to form the rows, and the rows come one over the other to form the structure of the main DRAM (2).

By changing the difference between the source voltage and the body voltage of the access transistor (211) inside a cell (21), the threshold voltage of the access transistor (211) can be adjusted. As the threshold voltage of a transistor (211) increases, that transistor (211) starts to leak less, and therefore, it can keep the data stored in the cell (21) in which the transistor (211) is located, for a longer time, i.e. the retention time increases. By applying a different threshold voltage to the transistor (211), the retention time of the transistor (211) can be increased and its tightness can be reduced.

In the DRAM structure (1) of the present invention, it is decided by the control unit (3) whether the bias voltage (B) will be applied to a row and therefore to each access transistor (211) in the cells (21) forming the row, and this decision is implemented through the multiplexer (4). In the preferred embodiment of the invention, it is checked whether there is access to the cells (21) in the DRAM structure while making the said decision. The processor accesses cells (21) in the DRAM structure for the purpose of reading and/or writing. There is no equal access to each cell (21) in the DRAM structure. For example, one cell may have more frequent access, while another cell may have less access. By tracking access to the cells (21) and the rows, an access pattern can be obtained that shows all this access. In the DRAM structure, which is the subject of the application, it is ensured that the body bias voltage (B) is applied to the rows according to the access pattern of the row. The threshold voltage (B) is increased by applying the body bias voltage to the rows/cells (21).

Data is stored in cells (21) in rows in DRAM and during the operation of the processor, when the data in the said rows and cells (21) are needed, those rows are accessed and the data held by the rows are read. At the same time, data can be written to the rows in DRAM, when the writing process is to be done, data is written to the relevant row.

When a row is accessed in DRAMs, it is more likely to be access it again. For example, when row 56 is accessed, that row is more likely to be re-accessed than the non-access rows, and that row will be accessed again.

By keeping a table in memory or a similar location, the pattern of rows accessed (access listing) is provided.

When the rows are accessed for the purpose of writing or reading data by the processor, the records of which row are accessed and when the table is accessed. In this way, the numbers of the rows accessed are stored in the table. In the table, the rows accessed and preferably the frequency of access are kept. The said table constitutes the access pattern of the rows. By looking at the access pattern of the rows, the access pattern of the cells (21) can also be obtained. From the data in the table, it is possible to determine which rows have access or not, and the numbers of the accessed rows are recorded in the table. The body bias voltage (B) is applied to the rows which are in the table and are accessible. By this way, voltage is not applied to the access rows in the table, the threshold values are increased by applying voltage to the rows located outside the table.

Because the rows in the table are already accessed rows, the data contained in the said rows is already used before the leak time, since there is frequent access to the mentioned rows and the data is used, there is no time for the accessed rows to lose data. In this case, the leak time does not exceed when the accessed rows will already lose data, and there is no need to update. Therefore, there is no need to apply the body bias voltage (B) to the rows accessed. The body bias voltage (B) is applied to the rows that are out of the table and are not accessible, and the threshold value of the transistors in the said rows is increased with the voltage and less leakage is ensured.

With the subject patent, access to the rows and cells (21) is used, and the threshold value of the transistors in the aforementioned rows is increased by adding the bias voltage (B) to the non-access rows. Thus, leakage currents are controlled by the bias voltage (B).

In the DRAM structure (1) of the invention, the control unit (3) is adapted to supply the required voltage to the rows from the selection input. The control unit (3) can supply the required voltage from the selection input according to the label data of the rows. The control unit (3) also accesses the access pattern of the DRAM structure (1) rows/cells preferably from the table in the memory. The control unit (3) is adapted to provide the bias voltage (B) to be supplied to the said rows and cells (21) in order to reduce the leakage current of the rows and cells (21) that are not accessible according to the access pattern of the rows and cells (21).

In the DRAM structure (1), when the rows, cells (21) are accessed for reading or writing purposes, the data in these rows are used, and since the data in the relevant rows are used, there is no need to refresh. The rows and cells (21) that are accessible do not need to be refreshed separately. The DRAM structure (1) subject to application works according to the said principle. The rows accessed for reading and writing in a DRAM structure (1) and the cells (21) in this row do not need refresh due to the access. Access to (1) the cells (21) in the DRAM structure can be through the processor or by a different hardware. In the DRAM structure (1) the non-access cells (21) are determined by the control unit (3) according to the access pattern. The access pattern is determined by a table. When the processor has access to any row, it records which row it has access to in the said table. The access of the processor to each row for reading or writing purposes is recorded as a record with the row number. In an embodiment of the invention, access to each row is recorded in the table along with the row number. The access pattern of the rows and cells is obtained with the said table. In the invention subject to application, the access pattern can be kept by different methods. The control unit (3) receives the access pattern (list) of the rows and cells accessed from the table it keeps or the table kept in memory. After determining the accessed cells (21), the control unit (3) detects the non-access cells (21). The control unit (3) generates an output signal for transmitting the bias voltage (B) to the cells (21) that are not accessible. The bias voltage (B) can be of different values. The control unit (3) is adapted to generate an output signal and transmit it to the multiplexer (4) to ensure that the bias voltage (B) is transmitted at a predetermined value. The bias voltage is applied to the cells (21) that are not accessible via the control unit (3). The bias voltage (B) increases the threshold value of the transistors in the cells (21), thereby extending the leakage time. Thus, there is no need to increase the refresh time frequency of the DRAM structure (1) due to the non-access rows and cells.

The control unit (3) decides whether the bias voltage (B) will be applied according to the access pattern values of the rows and the cells (21) and ensures that the bias voltage (B) is applied to the cells (21). In this embodiment, the control unit (3) can provide the application of different bias voltage (B) according to the access pattern.

The control unit (3) controls the operation of the multiplexer (4). It decides whether the bias voltage (B) connected to the selection input of the multiplexer (4) will be transmitted to the cells (21). The control unit (3) generates the output signal according to the access pattern of the DRAM structure (1). After the control unit (3) determines the cells (21) that are not accessible from the access pattern, it transmits a signal to the multiplexer (4) and provides the transmission of the bias voltage (B) to the cells (21) at a predetermined value.

When cells (21) that are not accessible are detected in the DRAM structure (1), the control unit (3) generates the required selection input for transmitting the bias voltage (B) from the output of the multiplexer (4) to the bias line (212). The bias voltage (B) to a row is taken from at least one of the data inputs of the multiplier (4) according to the voltage coming from the selection input of the control unit (3), and transmitted to the bias line (212) via the bias driver (5). The bias voltage (B) from the bias line (212) is applied to the sub terminal of the access transistor (211) of each cell (21) in this row. When the bias voltage (B) is applied to the access transistor (211), the threshold voltage of that transistor (211) increases. As the threshold voltage increases, the leakage of the transistor (211) decreases, thus the retention time of the cell (21) where that transistor (211) is located increases.

With the application of the bias voltage (B) to the cells (21), the leakage of all the cells (21) in a row decreases and the retention time increases. Thus, the refresh time for that row can be chosen longer and the frequency of refreshing is reduced. The bias voltage (B) can be applied at preferred frequency and time interval.

In an embodiment of the invention, access transistors (211) in each row are preferably connected to a single bias line (212). In another embodiment of the invention, the access transistors (211) in each row can be grouped and the bias line (212) can be connected to groups or each group separately. Access transistors (211) in each row are connected to the same and single bias line (212). A bias voltage (B) is applied to the access transistors (211) in each row over one and the same bias line (212). The bias voltage (B) from the bias line (212) is applied to the sub terminal of the access transistor (211) of each cell (21) in this row. When the bias voltage (B) is applied to the access transistor (211), the threshold voltage of that transistor (211) increases.

In a preferred embodiment of the invention, the control unit (3) is adapted to look at the access pattern of the cells (21) and to detect the non-access cells in order to decide whether bias voltage (B) is applied to a row.

In an embodiment of the invention, the multiplexer (4) can receive more than two inputs. The number of inputs to be received by the multiplexer (4) may vary depending on the access pattern classification and the bias voltage (B) (body bias voltage) levels that can be applied.

The access pattern of cells (21) and rows, when the cells are accessed, can be retained in different ways. The access pattern can be obtained by different methods and the bias voltage (B) can be applied to the cells (21) and the rows according to the obtained pattern. According to the access pattern, grouping and classification can be done between the rows if necessary. Depending on the number of groups or classes created, more than two body bias voltages (B) can be applied to rows or different rows.

The invention claimed is:

1. A dynamic random access memory structure adaptable according to an access pattern so as to allow for an adaptive application of a bias voltage to cells accessed by a processor and to access transistors of the cells that are not accessed according to the access pattern, the dynamic random access memory structure comprising:
   at least one main dynamic random access memory having at least one row of multiple cells, wherein each cell of the at least one row of multiple cells has an access transistor and a capacitor;
   a bias line connected to sub-terminals of the access transistors of the cells of the at least one row of multiple cells;
   at least one multiplexer controlling the bias voltage at a predetermined value supplied by said bias line;
   at least one control unit adapted to generate an output signal and to transmit the output signal to said at least one multiplexer so as to determine which of the cells are accessed and which of the cells are not accessed so as to cause the processor to write or read data, wherein the access pattern of the at least one row of multiple cells ensures that the bias voltage is transmitted at the predetermined value to the cells that are not accessed depending on a selection input of said at least one multiplexer and to control an operation of said at least one multiplexer; and at least one biasing driver in which the bias voltage to be transmitted to said bias line is received from at least one of a plurality of data inputs of said at least one multiplexer corresponding to data arriving at said at least one multiplexer from said at least one control unit.

2. The dynamic random access memory structure of claim 1, wherein said at least one control unit is adapted to give several different voltages to a selection input of said at least one multiplexer.

3. The dynamic random access memory structure of claim 1, wherein said bias line is a single bias line, the access transistor in each row of the at least one row of multiple cells being connected to the single bias line.

4. The dynamic random access memory structure of claim 1, wherein said bias line allows the biasing voltage to be supplied to the access transistors of each of the at least one row of multiple cells at a common time and an identical voltage.

5. The dynamic random access memory structure of claim 1, wherein said at least one control unit determines which of the cells are not accessed according to access information stored in a table in a memory of said at least one control unit and to increase a threshold value and a retention time of the access transistors of said at least one row of multiple cells by applying the bias voltage to the cells that are not accessed.

6. The dynamic random access memory structure of claim 1, wherein said at least one control unit is adapted to decide whether the bias voltage is to be applied to the cells of the at least one row of multiple cells according to the access pattern of the at least one row of multiple cells and to ensure that the predetermined bias voltage is applied to the cells of the at least one row of multiple cells.

7. The dynamic random access memory structure of claim 1, wherein said cells of the at least one row of multiple cells are in groups according to the access pattern, wherein more than two bias voltages are applied to the at least one row of multiple cells according to a number of the groups.

\* \* \* \* \*